(12) United States Patent
Pedersen et al.

(10) Patent No.: US 7,999,714 B2
(45) Date of Patent: Aug. 16, 2011

(54) CONTROLLING BIAS CURRENT FOR AN ANALOG TO DIGITAL CONVERTER

(75) Inventors: Trond Jarle Pedersen, Saupstad (NO); Einar Fredriksen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/542,520

(22) Filed: Aug. 17, 2009

(65) Prior Publication Data

US 2011/0037513 A1    Feb. 17, 2011

(51) Int. Cl.
*H03M 1/12* (2006.01)
(52) U.S. Cl. .................................................. 341/155
(58) Field of Classification Search .................. 341/155, 341/156, 161, 162, 163
See application file for complete search history.

(56) References Cited

U.S. PATENT DOCUMENTS

| | | | | |
|---|---|---|---|---|
| 6,134,430 A | * | 10/2000 | Younis et al. | 455/340 |
| 7,253,763 B2 | * | 8/2007 | Garlapati et al. | 341/155 |
| 7,750,837 B2 | * | 7/2010 | Wang et al. | 341/172 |
| 7,808,410 B2 | * | 10/2010 | Kim et al. | 341/136 |

* cited by examiner

*Primary Examiner* — Brian Young
(74) *Attorney, Agent, or Firm* — Baker Botts L.L.P.

(57) ABSTRACT

A converter includes an analog to digital converter having a bias current input, a control input, and an analog input to provide a digital output as a function of the analog input. A bias module is coupled to the bias current input to provide bias current to the analog to digital converter. A controller is coupled to the bias module and to the control input of the analog to digital converter. The controller controls the analog to digital converter to sample an analog input and controls the bias module to provide an operating bias current during sampling of the analog input and an idle bias current when not sampling the analog input.

16 Claims, 2 Drawing Sheets

CONTROLLING BIAS CURRENT FOR AN ANALOG TO DIGITAL CONVERTER

BACKGROUND

When an analog to digital converter is not converting an analog input to a digital output, it usually consumes about the same amount of power as when it is converting. In some systems, the analog to digital converter may be shut down when not needed to convert analog signals to digital signals. When a conversion is needed, it can take time to turn the analog to digital converter back on. This time is referred to as a startup time, and prevents use of an analog to digital converter circuit immediately after it is turned back on. When switched capacitor circuits are used, the startup times may last several clock cycles until the analog to digital converter reaches a proper working area.

In battery powered devices, the analog to digital converter may consume significant current even when the device is not being actively used. Still, the analog to digital converter is either left on and ready for conversion, or is turned off. Leaving it on may consume significant battery power. Turning it off, may lead to undesirable delays in using the device while the analog to digital converter is turned back on.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a digital signal processor, microcontroller, ASIC, microprocessor, or other type of processor operating on a computer system, such as a personal computer, server or other computer system.

Various embodiments are described to control bias current provided to an analog to digital converter to conserve current when the analog to digital converter is not being used to convert analog signals to digital signals. In some embodiments, an idle bias current may be provided when the analog to digital converter is not being used. The idle bias current is sufficient to keep the analog to digital converter working, and allows it to be quickly placed in a proper working range when an operating bias current is provided.

Figure 1:
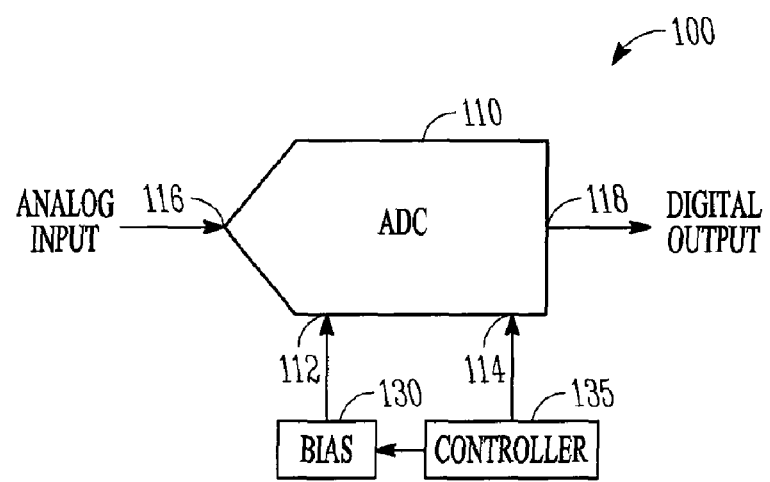
FIG. 1 is a block diagram of a system controlling current to an analog to digital converter according to an example embodiment.

FIG. 1 is a block diagram of a system 100 that controls bias current to an analog to digital converter 110 according to an example embodiment. The analog to digital converter 110 has a bias current input 112, a control input 114, and an analog input 116 to provide a digital output 118 as a function of signals provided to the analog input 116. A bias module 130 is coupled to the bias current input 112 to provide bias current to the analog to digital converter 110. The bias module 130 may be a current source circuit in one embodiment that is configured to provide at least two different bias currents. In further embodiments, the bias module 130 may be formed of different circuits, each providing a different level of bias current.

A controller 135 is coupled to the bias module 130 and to the control input 114 of the analog to digital converter 110. The controller 135 controls the analog to digital converter 110 to sample an analog input 116 and controls the bias module 130 to provide a bias current as a function of controlling the analog to digital converter 110 to sample the analog input.

In one embodiment, the controller 135 controls the bias module 130 to provide an operating bias current to the analog to digital converter 110 during sampling of the analog input. The controller 135 provides an idle bias current to the analog to digital converter 110 when the analog to digital converter 110 is not sampling the analog input. The controller 135 also may control the bias module 130 to switch from providing the idle bias current to provide the operating bias current when the controller 135 receives notification that a conversion is about to start.

In one embodiment, the controller 135 tracks the conversion and controls the bias module 130 to provide the idle bias current when a conversion is completed. This may result in the analog to digital converter 110 consuming current when provided the idle bias current at a current consumption rate of approximately 25% of current consumption compared to current consumption when provided an operating bias current. The idle bias current may be minimally sufficient to enable the analog to digital converter to run, but may not be sufficient to keep it in a sufficient working range when actually converting signals. The idle bias current may be determined by calculation, simulation, or a combination of both in various embodiments.

The functions of the controller may be performed by one or more modules in the controller. In one embodiment, a module receives a notification of a conversion of an analog signal to a digital signal to be performed by the analog to digital converter 110. The analog signal in various embodiments may be a signal originating from many different types of devices. In one particular device, the analog signal may originate from a receive or sense electrode of a touchscreen. The controller 135 further has a module to control the bias module 130 to increase bias current to be provided to the analog to digital converter 110, from an idle bias current to an operating bias current. Yet a further module may be used to monitor the conversion and control the bias module 130 to decrease bias current from the operating bias current to the idle bias current.

In one embodiment, the controller module to control the bias current module increases the bias current such that the analog to digital converter 110 is operational without delaying the conversion of the analog signal to the digital signal. The controller 135 may also include a module to control the analog to digital converter 110 to sample the analog input after increasing the bias current.

Figure 2:
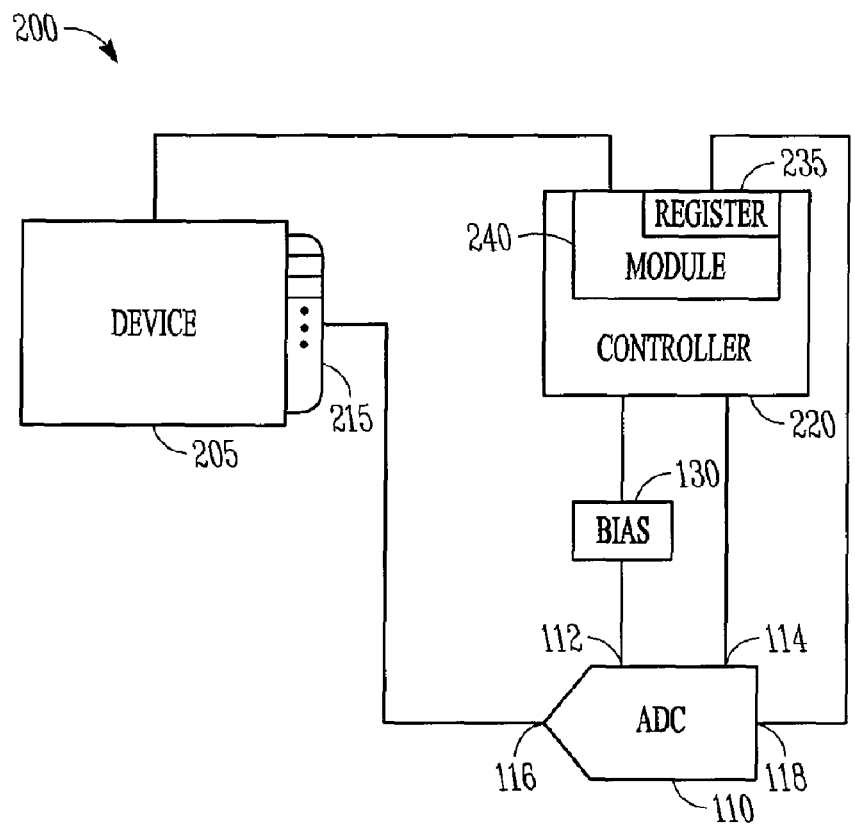
FIG. 2 is a block diagram of a system of an analog to digital converter coupled to a device and controller according to an example embodiment.

FIG. 2 is a block diagram of a system 200 for controlling and converting analog signals from a device 205 while controlling current to the analog to digital converter 110. The device 205 may provide multiple analog outputs on lines 215.

Multiple analog to digital converters 110 (one is shown to represent multiple analog to digital converters) may each coupled to at least one of the analog outputs on lines 215. Each analog to digital converter 110 may have a bias current input 112, a control input 114, and an analog input 116 to provide a digital output 118 as a function of the analog input 116. The digital output at 118 may be coupled to register a 235 in a controller 220 to provide the digital values to a module 240 in controller 220. The module 240 may be used to process the values in a digital manner in accordance with the purpose of the device 205 and in some embodiments may provide and receive signals from device 205.

A bias module 130 may be coupled to the bias current inputs 112 to provide bias current to the analog to digital converters 110. The controller 220 may be coupled to the bias module or modules and to the control inputs 114 of the analog to digital converters 110, The controller 220 may be used to control the analog to digital converters 110 to sample an analog input 116 from the device 205 via lines 215. The controller 220 may also control the bias module 130 to provide a bias current as a function of controlling the analog to digital converters 110 to sample the analog input. In one embodiment, there is a separate bias module 130 for each analog to digital converter 110.

In one embodiment, the controller 220 controls the bias module to provide an operating bias current to the analog to digital converter 110 during sampling the analog input from lines 215, and to provide an idle bias current to the analog to digital converter 110 when the analog to digital converter is not sampling analog input.

In one embodiment, the controller 220 controls the bias module 130 to provide the operating bias current when the controller 220 receives notification that a conversion is to start. Controller 220 may be controlling the device 205, and will be aware of when it plans to do so. In further embodiments, the control function provided to the analog to digital converter 110 may be separate from controller 220 used to interface directly with device 205 and may receive notifications from controller 220 regarding impending receipt of analog signals from device 205. Thus, in one embodiment, the controller 220 tracks the conversions and controls the bias module 130 to provide the idle bias current when a conversion is completed.

Figure 3:
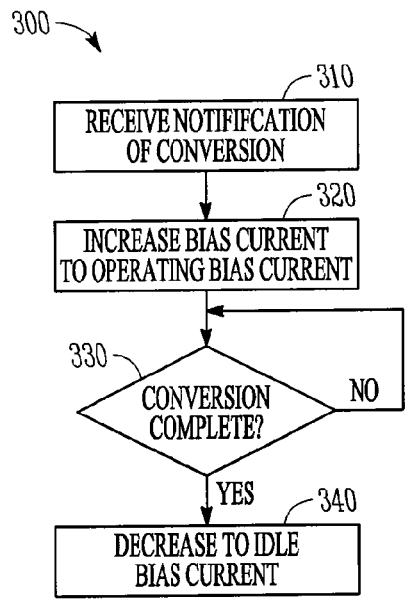
FIG. 3 is a flowchart of a method for controlling bias current to an analog to digital converter according to an example embodiment.

FIG. 3 is a flowchart of a method 300 for controlling bias current to an analog to digital converter. The method 300 starts with a controller receiving a notification of a conversion of an analog signal to a digital signal at 310. A bias current module is controlled at 320 to increase bias current to be provided to an analog to digital converter from an idle bias current to an operating bias current. Upon completion of the conversion as detected at 330, the bias current module is controlled at 340 to decrease bias current from the operating bias current to the idle bias current. In one embodiment, the bias current is increased such that the analog to digital converter is operational without delaying the conversion of the analog signal to the digital signal. In a further embodiment, the analog to digital converter is controlled to sample the analog input after increasing the bias current.

Figure 4:
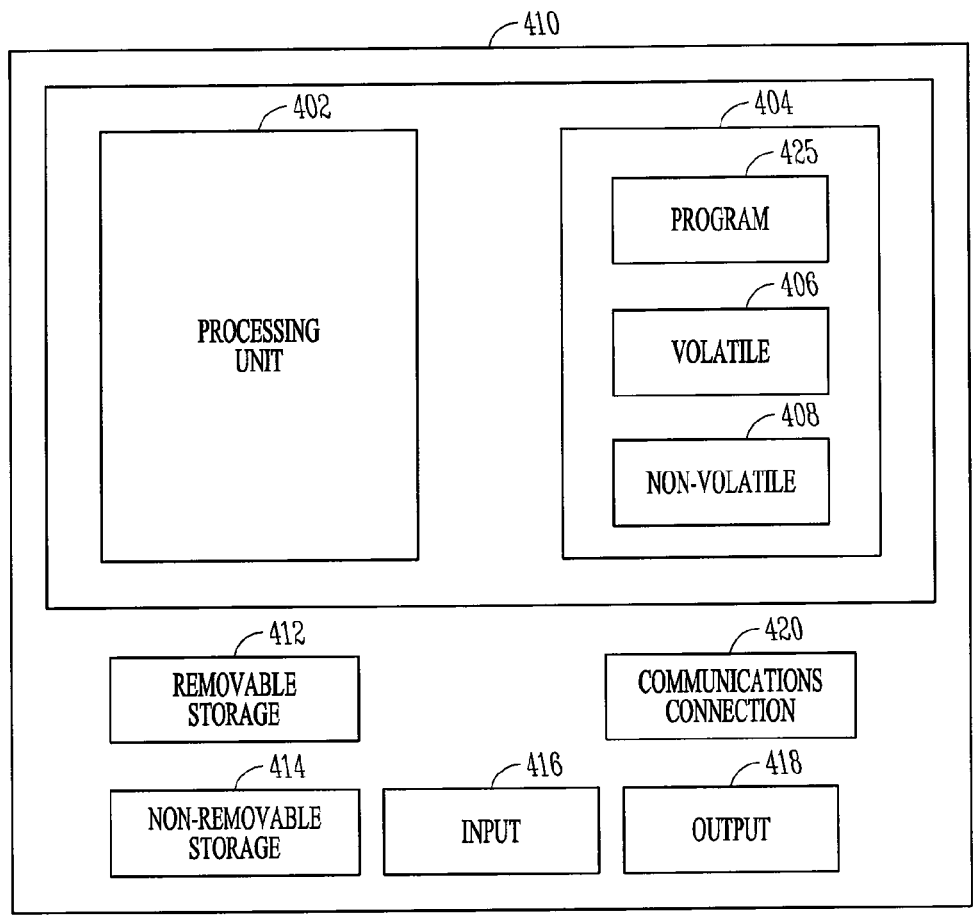
FIG. 4 is a block diagram of a computer system or microcontroller for performing methods to control current to an analog to digital converter according to an example embodiment.

FIG. 4 is a block diagram of a computer system or microcontroller for performing methods to control current to an analog to digital converter according to an example embodiment. A general computing device in the form of a computer 410, may include a processing unit 402, memory 404, removable storage 412, and non-removable storage 414. Microcontroller implementations need not include all the elements of the computer 410, such as the removable storage elements, and may be implemented on a single semiconductor chip. Memory 404 may include volatile memory 406 and non-volatile memory 408. Computer 410 may include—or have access to a computing environment that includes—a variety of computer-readable media, such as volatile memory 406 and non-volatile memory 408, removable storage 412 and non-removable storage 414. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 410 may include or have access to a computing environment that includes input 416, output 418, and a communication connection 420. The computer may operate in a networked environment using a communication connection to connect to one or more remote computers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 402 of the computer 410. A hard drive, CD-ROM, and RAM are some examples of articles including a computer-readable medium.

The invention claimed is:

1. A converter comprising:
an analog-to-digital converter (ADC) configured to receive a bias-current input, a control input, and an analog input and to provide a digital output as a function of the analog input;
a bias module coupled to the ADC and configured to provide the bias-current input to the (ADC); and
a controller coupled to the bias module and to the ADC, the controller being configured to:
control the ADC to sample the analog input; and
control the bias module to provide to the ADC:
an operating bias current as the bias-current input when the ADC is sampling the analog input; and
an idle bias current as the bias-current input when the ADC is not sampling the analog input.

2. The converter of claim 1, wherein the controller is configured to control the bias module to provide the operating bias current when the controller receives notification that a conversion is to start.

3. The converter of claim 2, wherein the controller is configured to monitor the conversion and to control the bias module to provide the idle bias current when the conversion is completed.

4. The converter of claim 2, wherein the ADC consumes current when provided the idle bias current at a current-consumption rate of approximately 25% of its current consumption when provided the operating bias current.

5. The converter of claim 1, wherein the idle bias current is minimally sufficient to enable the ADC to run.

6. A controller comprising:
   a module configured to receive a notification of a conversion of an analog signal to a digital signal;
   a module configured to control a bias-current circuit to increase bias current to an analog-to-digital converter (ADC) from an idle bias current to an operating bias current and to control the ADC to start sampling the analog signal; and
   a module configured to monitor the conversion and, when the conversion is completed, control the bias-current circuit to decrease bias current from the operating bias current to the idle bias current and to control the ADC to stop sampling the analog signal.

7. The controller of claim 6, wherein the ADC remains operational during the increase in the bias current without substantially delaying the conversion of the analog signal to the digital signal.

8. The controller of claim 7, wherein the ADC consumes current when provided the idle bias current at a current-consumption rate of approximately 25% of its current consumption when provided an operating bias current.

9. A system comprising:
   plurality of analog-to-digital converters (ADCs) that are each configured to receive at least one of a plurality of analog inputs, a bias-current input, and a control input to provide a digital output as a function of its at least one of the analog inputs;
   a bias module coupled to the ADCs and configured to provide the bias-current inputs to the ADCs; and
   a controller coupled to the bias module and to the ADCs, the controller being configured to:
      control the ADCs to sample at least some of the analog inputs; and
      control the bias module to provide each of the ADCs:
         an operating bias current as a bias-input current when the ADC is sampling one or more of its at least one of the analog inputs; and
         an idle bias current as its bias-input current when the ADC is not sampling one or more of its at least one of the analog inputs.

10. The system of claim 9, wherein the controller is configured to control the bias module to provide the operating bias current to the ADC when the controller receives notification that a conversion by the ADC is to start.

11. The system of claim 10, wherein the controller is configured to monitor the conversion and to control the bias module to provide the idle bias current when the conversion is completed.

12. The system of claim 10, wherein each of the ADCs consumes current when provided an idle bias current at a current-consumption rate of approximately 25% of current consumption when provided an operating bias current.

13. The system of claim 9, wherein the idle bias current is minimally sufficient to enable the ADC to run.

14. A method comprising:
   receiving a notification of a conversion of an analog signal to a digital signal;
   controlling a bias-current module to increase bias current to an analog-to-digital converter (ADC) from an idle bias current to an operating bias current and to control the ADC to start sampling the analog signal; and
   when the conversion is completed, controlling the bias current module to decrease the bias current from the operating bias current to the idle bias current and to control the ADC to stop sampling the analog signal.

15. The method of claim 14, wherein the ADC remains operational during the increase in the bias current without delaying the conversion of the analog signal to the digital signal.

16. The method of claim 14, wherein the ADC consumes current when provided the idle bias current at a current-consumption rate of approximately 25% of current consumption when provided the operating bias current.

* * * * *